(12) United States Patent
Rolfson

(10) Patent No.: US 6,183,915 B1
(45) Date of Patent: Feb. 6, 2001

(54) METHOD OF FORMING A PHASE SHIFTING RETICLE

(75) Inventor: J. Brett Rolfson, Boise, ID (US)

(73) Assignee: Micron Technology, Inc., Boise, ID (US)

( * ) Notice: Under 35 U.S.C. 154(b), the term of this patent shall be extended for 0 days.

(21) Appl. No.: 09/200,030

(22) Filed: Nov. 25, 1998

(51) Int. Cl.$^7$ ........................................................ G03F 9/00
(52) U.S. Cl. ................................................................ 430/5
(58) Field of Search ............................ 430/5, 311, 313; 216/12

(56) References Cited

U.S. PATENT DOCUMENTS

| | | | |
|---|---|---|---|
| 5,194,344 | 3/1993 | Cathey, Jr. et al. | 430/5 |
| 5,194,345 | 3/1993 | Rolfson | 430/5 |
| 5,194,346 | 3/1993 | Rolfson et al. | 430/5 |
| 5,225,035 | 7/1993 | Rolfson | 156/643 |
| 5,240,796 | 8/1993 | Lee et al. | 430/5 |
| 5,281,500 | 1/1994 | Cathey et al. | 430/5 |
| 5,292,623 | * 3/1994 | Kemp et al. | 430/313 |
| 5,376,483 | 12/1994 | Rolfson | 430/5 |
| 5,468,578 | 11/1995 | Rolfson | 430/5 |
| 5,495,959 | 3/1996 | Rolfson | 216/12 |
| 5,576,126 | 11/1996 | Rolfson | 430/5 |
| 5,667,918 | 9/1997 | Brainerd et al. | 430/5 |
| 5,672,450 | 9/1997 | Rolfson | 430/5 |
| 5,766,829 | 6/1998 | Cathey, Jr. et al. | 430/394 |
| 5,879,866 | * 3/1999 | Starikov et al. | 430/395 |
| 5,955,222 | * 9/1999 | Hibbs et al. | 430/5 |

* cited by examiner

Primary Examiner—Mark F. Huff
Assistant Examiner—Saleha R. Mohamedulla
(74) Attorney, Agent, or Firm—Wells, St. John, Roberts, Gregory & Matkin P.S.

(57) ABSTRACT

The invention comprises forming of phase shifting reticles. In but one aspect, a method of forming a phase shifting reticle includes providing a substrate comprising light restricting material over light transmissive material. A photosensitive resist layer is deposited over the light restricting material. A pattern of openings is formed through the resist layer and into the light restricting material. Depressions are etched into the light transmissive material through the openings while at least some of the resist layer remains over the light restricting material. After this etching, exposed light transmissive material is etched to form phase shift areas therein. In but one aspect, a method of forming a phase shifting reticle comprises providing a substrate comprising an antireflective material formed over a reflective light restricting material formed over a light transmissive material. A photosensitive resist layer is deposited over the antireflective material. A pattern of openings is formed through the resist layer, through the antireflective material and through the reflective light restricting material to form a mask pattern having light transmissive areas and light restricting areas over the substrate. All of the antireflective coating material over the light restricting areas is masked within the mask pattern while etching light transmissive material within all light transmissive areas within the mask pattern. Some of the light transmissive areas are formed to comprise phase shift areas.

37 Claims, 3 Drawing Sheets

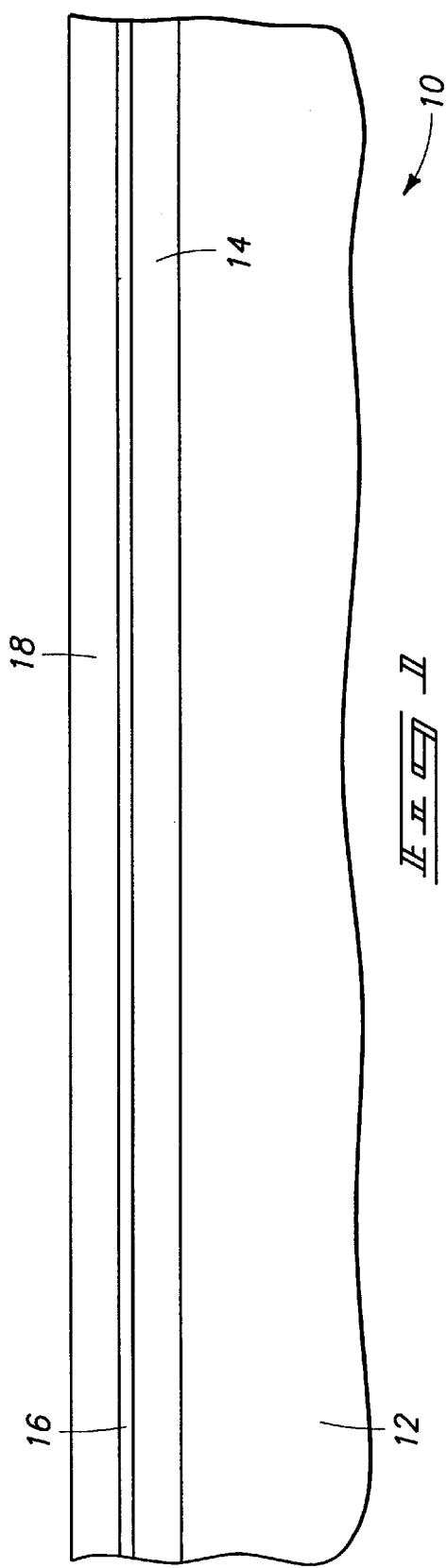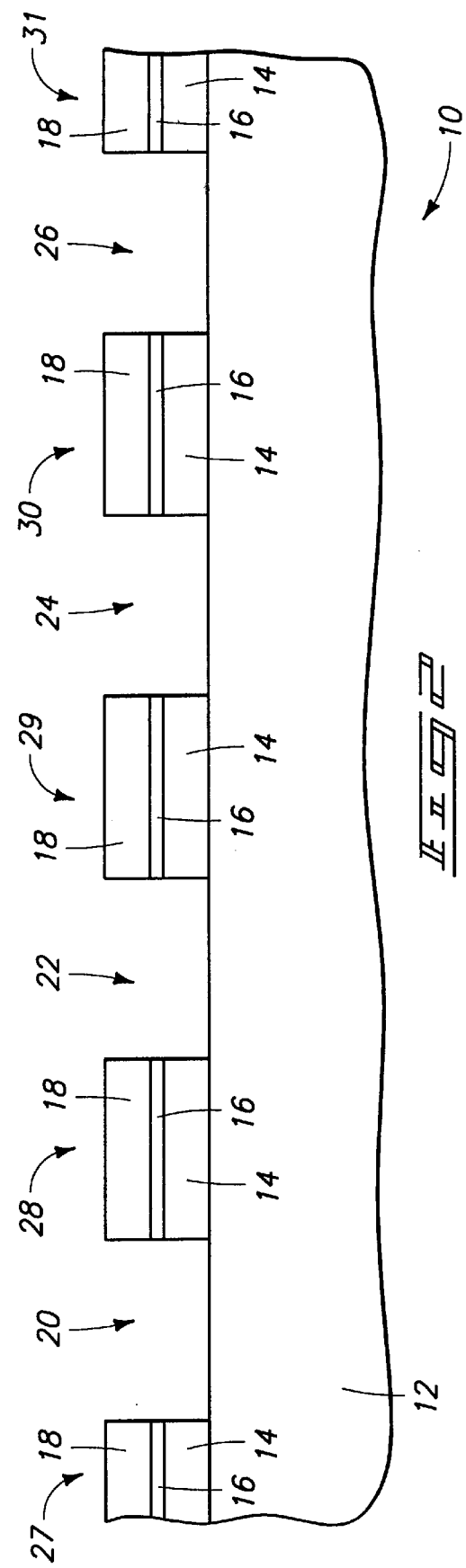

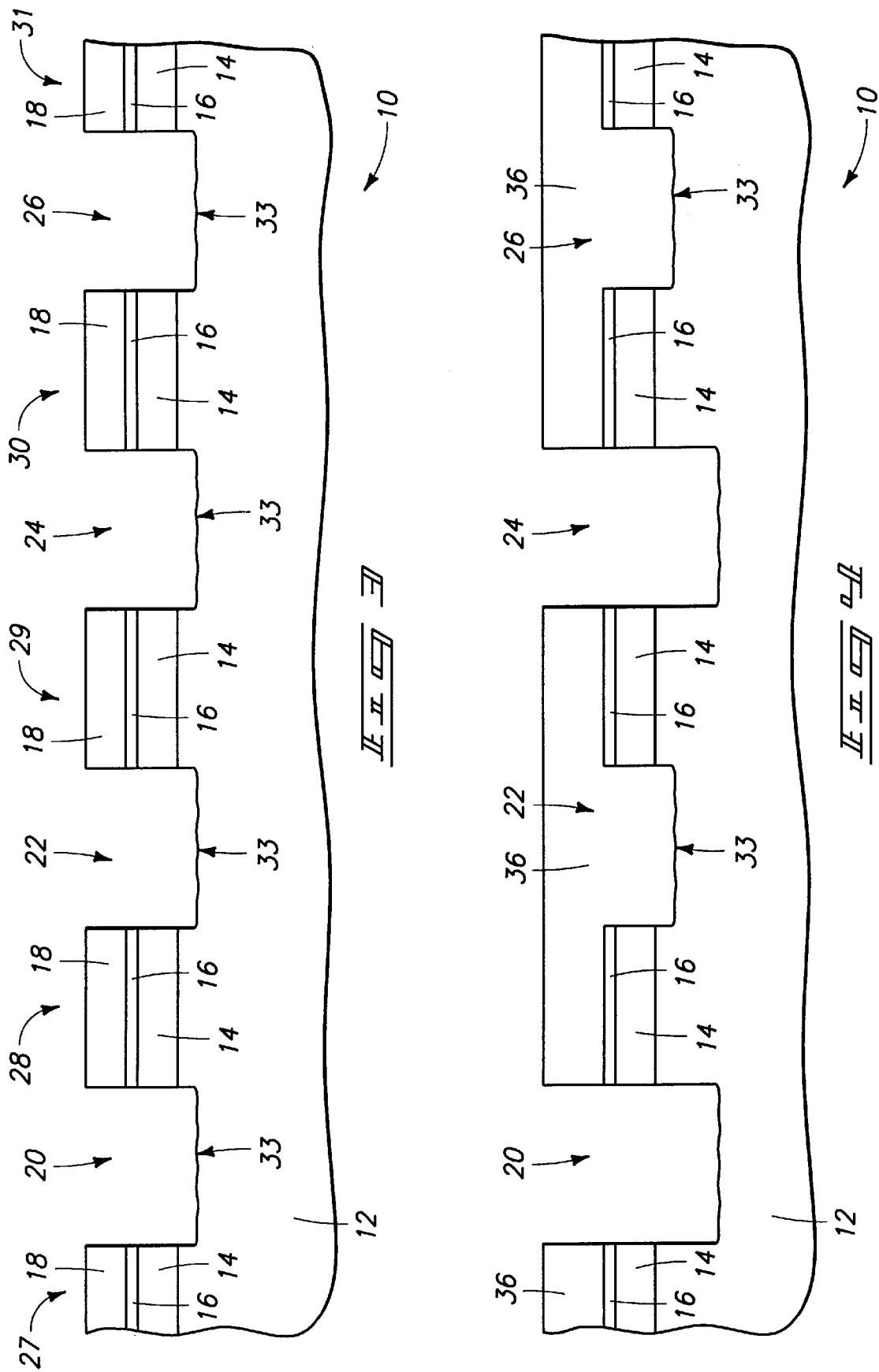

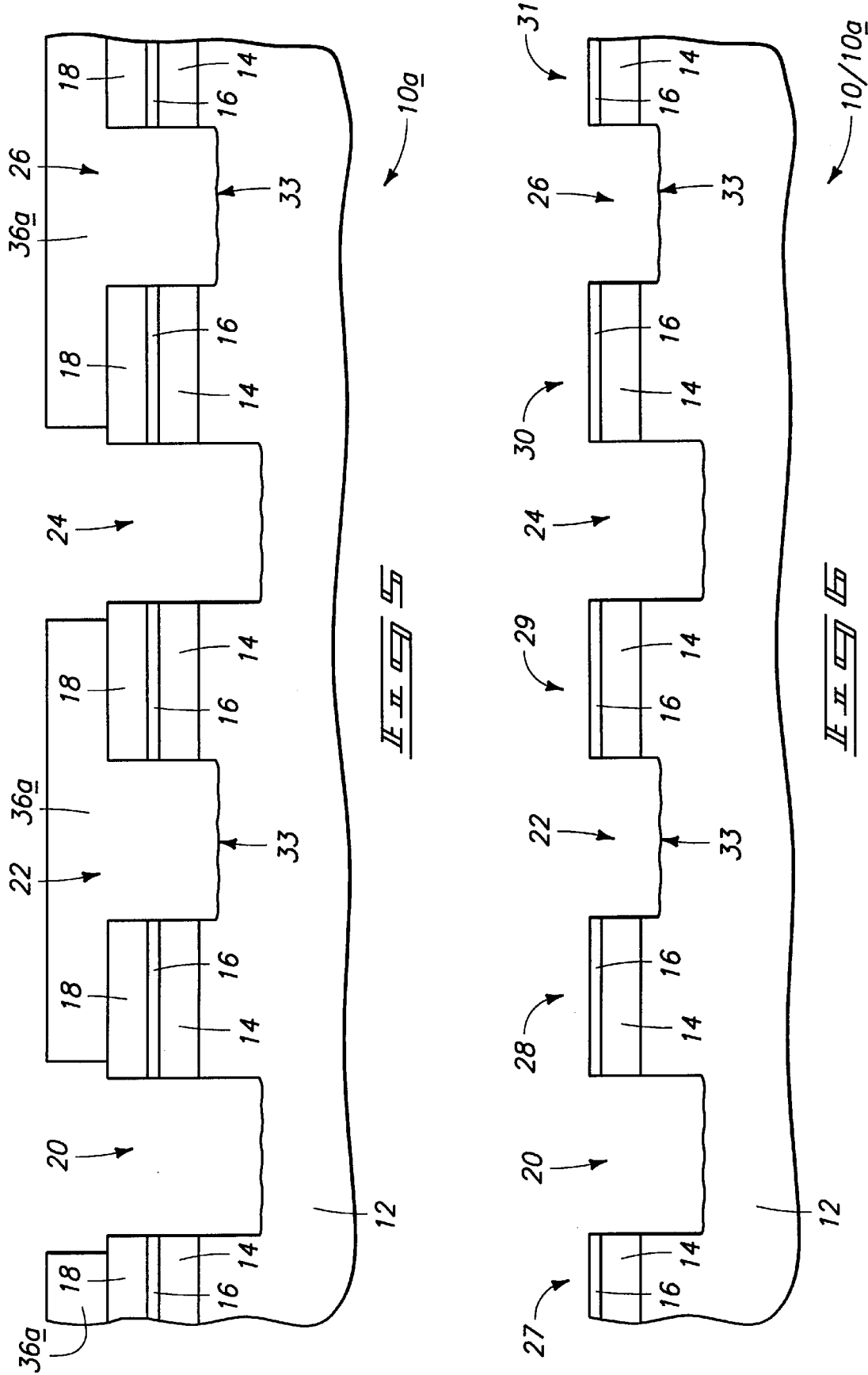

METHOD OF FORMING A PHASE SHIFTING RETICLE

PATENT RIGHTS STATEMENT

This invention was made with Government support under Contract No. MDA972-92-C-0054 awarded by Advanced Research Projects Agency (ARPA). The Government has certain rights in this invention.

TECHNICAL FIELD

This invention relates to methods of forming phase shifting reticles.

BACKGROUND OF THE INVENTION

In semiconductor manufacturing, photolithography is used in the formation of integrated circuits on a semiconductor wafer. During a lithographic process, a form of radiant energy such as ultraviolet light is passed through a mask/reticle and onto the semiconductor wafer. The mask contains light restricting regions (for example totally opaque) and light transmissive regions (for example totally transparent) formed in a predetermined pattern. A grating pattern, for example, may be used to define parallel-spaced conductive lines on a semiconductor wafer. The wafer is provided with a layer of photosensitive resist material, commonly referred to as photoresist. Ultraviolet light passed through the mask onto the layer of photoresist thereby transfers the mask pattern therein. The resist is then developed to remove either the exposed portions of resist for a positive resist or the unexposed portions of the resist for a negative resist. The remaining patterned resist can then be used as a mask on the wafer during a subsequent semiconductor fabrication step, such as ion implantation or etching relative to layers on the wafer beneath the resist.

As microcircuit densities have increased, the size of the features of semiconductor devices has decreased to the submicron level. These submicron features may include the width and spacing of metal conducting lines or the size of various geometric features of active semiconductor devices. Utilization of submicron features in semiconductor manufacture has resulted in the development of improved lithographic processes and systems. One such improvement is known as phase shift lithography. With this technique, the interference of light rays is used to overcome diffraction and improve the resolution and depth of optic images projected onto a target. In phase shift lithography, the phase of an exposure light at the object is attempted to be controlled such that adjacent bright areas are formed preferably 180° out-of-phase with one another. Better dark regions are thus produced between the bright areas by destructive interference even when diffraction would otherwise cause these areas to be less defined at the edges or otherwise lit to some degree. This technique improves total resolution at the object and has been used where resolutions fall to well below one micron, such as at 0.25 micron and below.

Non-phase shift lithographic masks generally contain only transparent and opaque areas. A phase shifting mask is constructed with the repetitive pattern formed of three distinct regions. A first region or layer comprises light restricting material that ideally allows no light transmission. A second light transmissive layer or region provides areas which preferably allow near 100% of incident light to pass therethrough. A third phase shifting area also preferably allows near 100% of the light to pass through, but at a preferred phase shifted 180° from the light passing through the second non-phase shifted light transmissive area. The light transmissive areas and phase shift areas are situated such that light rays diffracted from the edges of the light restricting material and through the light transmissive and phase shift areas are essentially canceled out in a darkened area therebetween. This creates a pattern of dark and bright areas which can be used to clearly delineate features of a pattern defined by the mask at submicron dimensions, and onto a photo-patterned semiconductor wafer.

Different techniques have been developed in the art for fabricating different types of phase shifting masks. One type of mask is formed on a transparent substrate, such as polished quartz. An opaque layer, formed of a material such as chromium, is deposited on the transparent substrate and etched with a pattern of apertures. This forms opaque areas on the mask which, combined with the pattern of apertures, carry the desired pattern. With a phase shifting mask, the transparent areas in phase shift areas are formed within the apertures in an alternating pattern with respect to the opaque areas.

The phase shift areas of the mask pattern may be formed by providing a phase shifting material into every other aperture (i.e., an additive process). Alternately, phase shift areas may be formed by etching a depression/groove in every other aperture (i.e., a subtractive process). With this type of phase shifting structure, the light passing through a grooved aperture travels a shorter distance within the substrate relative to light passing through an aperture formed over the full thickness of the substrate. Light beams exiting adjacent apertures of the mask therefor have a phase difference. This phase difference is preferably 180°, or some odd multiple thereof, so that light waves cancel out at the wafer.

The invention was principally motivated in connection with problems associated with subtractive phase shifting reticle processes, and utilizing highly reflective opaque material. Yet as will be appreciated by the artisan, the invention will have applicability in additive or other processes, and using other than reflective materials, including processes and materials yet to be developed, with the invention only being limited by the accompanying claims both as literally worded and as interpreted in accordance with the Doctrine of Equivalents.

An earlier of my inventions is described in U.S. Pat. No. 5,225,035, which issued on Jul. 6, 1993. That invention was motivated to overcome a problem created with different light diffraction/transmissive properties which occur when light exits etched and unetched portions of a reticle. The invention the subject of this disclosure was motivated in part as a further improvement over my U.S. Pat. No. 5,225,035 described invention as particularly motivated in use of reticles utilizing highly reflective, opaque materials having antireflective material formed thereover.

Specifically, chromium and other reflective metals are commonly used as the opaque regions in reticle fabrication. Such material is highly light reflective, which can further cause problems with respect to the pattern being produced in the photoresist on the wafer. One technique used to minimize the reflection is to provide an antireflective layer over the chromium layer prior to fabrication of the pattern on the reticle. One example class of antireflective materials is chromium oxides, either deposited onto the reticle or formed by oxidizing the outer portion of a deposited chromium layer. Unfortunately, the preferred embodiment etching of all the transparent areas and phase shift areas in the '035 disclosure also resulted in etching of at least some of the antireflective coating material from some of the opaque regions.

SUMMARY OF THE INVENTION

The invention comprises forming of phase shifting reticles. In but one aspect, a method of forming a phase shifting reticle includes providing a substrate comprising light restricting material over light transmissive material. A photosensitive resist layer is deposited over the light restricting material. A pattern of openings is formed through the resist layer and into the light restricting material. Depressions are etched into the light transmissive material through the openings while at least some of the resist layer remains over the light restricting material. After this etching, exposed light transmissive material is etched to form phase shift areas therein.

In but one aspect, a method of forming a phase shifting reticle comprises providing a substrate comprising an antireflective material formed over a reflective light restricting material formed over a light transmissive material. A photosensitive resist layer is deposited over the antireflective material. A pattern of openings is formed through the resist layer, through the antireflective material and through the reflective light restricting material to form a mask pattern having light transmissive areas and light restricting areas over the substrate. All of the antireflective coating material over the light restricting areas is masked within the mask pattern while etching light transmissive material within all light transmissive areas within the mask pattern. Some of the light transmissive areas are formed to comprise phase shift areas.

BRIEF DESCRIPTION OF THE DRAWINGS

Preferred embodiments of the invention are described below with reference to the following accompanying drawings.

FIG. 1 is the diagrammatic sectional view of a mask blank at one processing step in accordance with the invention.

FIG. 2 is a view of the FIG. 1 blank at a processing step subsequent to that shown by FIG. 1.

FIG. 3 is a view of the FIG. 1 blank at a processing step subsequent to that shown by FIG. 2.

FIG. 4 is a view of the FIG. 1 blank at a processing step subsequent to that depicted by FIG. 3.

FIG. 5 is an alternate embodiment view of the FIG. 1 blank at a processing step subsequent to that depicted by FIG. 3.

FIG. 6 is a view of the FIG. 1 blank at a processing step subsequent to that shown by either FIGS. 4 or 5.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Referring to FIG. 1, a reticle substrate in process is indicated generally with reference numeral 10. Such comprises a light transmissive material 12 (i.e., quartz), and a light restricting material 14 formed thereon and accordingly thereover. Material 14 is ideally opaque to at least 99% transmission of light to be used in subsequent photoprocessing of semiconductor materials, and light transmissive material 12 is preferably transparent to at least 99% light transmission of the same light. An example material for layer 14 is a highly reflective material, such as chromium deposited to an example thickness of 800 Angstroms. An antireflective material 16 is formed over light restricting material 14. Such layer may or may not be opaque, with chromium oxide deposited to an example thickness of 200 Angstroms being but one example. An example process for forming layers 14 and 16 is by physical vapor deposition from an elemental or alloy chromium source/target, whereby oxygen is introduced into the processing chamber to form the last 200 Angstroms in the form of a chromium oxide which functions as an antireflective coating. A photosensitive resist layer 18 is deposited over antireflective material 16 and light restrictive material 14. Layer 18 might constitute a negative or a positive photoresist, with a positive photoresist being utilized in this example.

Referring to FIG. 2, a pattern of openings 20, 22, 24 and 26 have been patterned through resist layer 18 and into light restricting material 14. As depicted, such openings are formed through antireflective material 16 and through light restricting material 14 to light transmissive material 12. Such can be processed by initially photo exposing resist layer 18 and developing thereof, followed by wet or dry etching of layers 16 and 14. An example etch chemistry and conditions for etching layers 16 and 14 substantially selective relative to a quartz light transmissive material 12 comprises $Cl_2$ at 60 sccm and 15 sccm $O_2$ at 50 mTorr pressure and power at 65 W in a Plasma-Therm Shuttlelock-700 reactor, manufactured by Plasma-Therm of St. Petersburg, Fla. Such forms a mask pattern over some area of substrate 10 having light transmissive areas (i.e., defined by openings 20, 22, 24 and 26 in the illustrated section) and light restricting areas (i.e., areas 27, 28, 29, 30 and 31).

Referring to FIG. 3, etching is conducted of light transmissive material 12 through openings 20, 22, 24 and 26 while at least some of the resist layer remains over antireflective material 16 and light restricting material 14. Depressions 33 are formed relative to the original outer surface of substrate/material 12. In the illustrated and preferred embodiment, all of antireflective coating material 16 over light restricting areas 27, 28, 29, 30 and 31 is masked within the mask pattern while etching exposed light transmissive material 12 within all light transmissive areas within the mask pattern. Accordingly, the masking preferably comprises use of a photosensitive material, and most preferably comprises use of photosensitive resist layer 18 which was used to pattern and form light restricting areas 27, 28, 29, 30 and 31. Further, etching of material 12 is conducted regardless of whether depressions are formed. In other words, minor etching in the form of surface roughening could be conducted or achieved relative to material 12 without forming depressions. In the context of this document, a "depression" is considered to be anything having a depth of at least 50 Angstroms, with a preferred depth and range for the illustrated depressions being from 500 Angstroms to 2500 Angstroms. An example preferred etching chemistry is dry plasma anisotropic etching. A specific example is 80 sccm $CHF_3$ at 100 mTorr and 90 W power using the above Shuttlelock 700 processor. Accordingly, the subject etching is typically and most preferably differrnt in chemistry from that utilized in etching the antireflective and light restricting materials.

Some of the light transmissive areas are formed to comprise phase shifting areas, and such preferably occurs after the above-described masking and etch as provided in the continuing example below. Alternately but less preferred, the invention contemplates forming phase shift areas from some of the light transmissive areas prior to the above-described masking of all of the antireflective coating material. Further most preferably, the formation of the phase shift areas comprises removal, preferably by etching, of some of the light transmissive material within the light transmissive areas of those areas to comprise phase shift areas. Accordingly, the preferred processing is subtractive in nature, although additive processes are also contemplated.

Referring to FIG. 4, all of resist layer 18 has been removed from over antireflective material 16 and light restrictive material 14. Another layer 36 of photosensitive resist, for example preferably a different resist than the first utilized material, is formed over the substrate to preferably mask all of antireflective coating material 16 within the light restricting areas within the mask pattern. Such masking effectively also masks all of only some light transmissive areas over the substrate. For example in the section of the substrate as shown, all of light transmissive regions 22 and 26 are masked by photosensitive resist layer 36 after exposure and develop, while areas 20 and 24 are unmasked. Etching is then conducted of exposed light transmissive material, thus forming phased shift areas therein within the illustrated regions or areas 20 and 24. Such etching is preferably conducted as a timed etch, for example utilizing the same etching chemistry and conditions as utilized to form depressions 33. Accordingly in this example, at least some photosensitive material is utilized other than resist layer 18 in the masking, with here none of layer 18 being utilized in the masking and etch which forms the phase shift areas.

One example resist material for layer 18 is ZEP 7000 manufactured by the Nippon Zeon Co. Ltd., of Tokyo Japan, while one example material for layer 36 is IP 3600 manufactured by Tokyo Ohka Kogyo Co. Ltd. also of Tokyo, Japan. The first layer 18 of resist would preferably be processed using an EBeam maskwriter, such as MEBES-5000 manufactured by Etec Systems of Hayward, Calif. An example processing for resist layer 36 utilizes and ALTA-3500 Laser Maskwriter also available from Etec Systems.

The FIG. 4 processing desirably achieves very close alignment tolerances relative to the masking to form the illustrated masking block regions 36 to coincidingly align with the outermost edges of the respective light restricting areas. A perhaps more preferred embodiment providing more room for misalignment tolerance is described with reference to FIG. 5. Like numerals from the first described embodiment have been utilized where appropriate, with differences being indicated with the suffix "a". Here, at least some, and preferably all as shown, of photosensitive resist layer 18 remains on the substrate while conducting the secondary etching utilized to form the phase shift areas. Accordingly, layer 36a as shown and patterned constitutes another layer of photosensitive resist which is provided over resist material 18. Accordingly, resist 36a is preferably not patterned to necessarily perfectly align relative to the light restrictive areas, as the entirety of the antireflective coating layer 16 is protected or masked by photosensitive resist material 18. Further, preferred patterning of photosensitive resist material in this embodiment in the light restricting areas produces different thickness therein due to the illustrated cut-back or recessing of the edges of layer 36a relative to those of material 18 for areas 20 and 24.

Referring to FIG. 6, all photosensitive material ultimately remaining over substrate 10/10a is preferably ultimately removed.

In accordance with but one aspect of the invention, two discrete etching steps are conducted. In one, light transmissive material within all of the light transmissive areas within the mask pattern is etched. In another, light transmissive material within only some of the light transmissive areas within the mask pattern is etched to form phase shift areas from at least some of said only some light transmissive areas. This example of this invention, but only in one considered aspect, has this in common with my U.S. Pat. No. 5,225,035 disclosure. Yet in this considered aspect of the invention, such differs from that of the U.S. Pat. No. 5,225,035 disclosure in that etching of said all of the light transmissive areas occurs before the etching of said only some light transmissive areas. Further in preferred aspects of this invention, photosensitive resist material, or some other masking material, is received over the totality of the light restricting area within the mask pattern during the etching of said all of the light transmissive areas. Further preferred, photosensitive resist material is received over the totality of the light restricting area within the mask pattern during the etching of said only some of the light transmissive areas.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming a phase shifting reticle comprising:

providing a substrate comprising light restricting material over light transmissive material;

depositing a photosensitive resist layer over the light restricting material;

forming a pattern of openings through the photosensitive resist layer and into the light restricting material, the openings in the light restricting material being formed using the photosensitive resist layer as a mask;

first etching depressions into the light transmissive material through the openings in the light restricting material while at least some of the same photosensitive resist layer from which the openings in the light restricting material were made remains over the light restricting material; and after the first etching, second etching exposed light transmissive material to form phase shift areas therein.

2. The method of forming a phase shifting reticle of claim 1 wherein the first and second etchings are conducted using substantially the same etching chemistry and conditions.

3. The method of forming a phase shifting reticle of claim 1 comprising removing all of said photosensitive resist layer from over the light restricting material prior to conducting the second etching.

4. The method of forming a phase shifting reticle of claim 1 comprising leaving at least some of said photosensitive resist layer over the light restricting material while conducting the second etching.

5. The method of forming a phase shifting reticle of claim 1 comprising leaving at least some of said photosensitive resist layer over the light restricting material while conducting the second etching, and forming another photosensitive resist layer over said photosensitive resist layer over the light restricting material prior to conducting the second etching.

6. The method of forming a phase shifting reticle of claim 5 wherein said photosensitive resist layer over the light restricting material and said another photosensitive resist layer constitute different resist materials.

7. The method of forming a phase shifting reticle of claim 1 wherein the second etching is conducted while masking all of some of said openings in the light restricting material with a photosensitive resist material.

8. The method of forming a phase shifting reticle of claim 1 comprising removing all of said photosensitive resist layer from over the light restricting material prior to conducting the second etching, and wherein the second etching is conducted while masking all of some of said openings in the light restricting material with a photosensitive resist material.

9. The method of forming a phase shifting reticle of claim 1 comprising leaving at least some of said photosensitive resist layer over the light restricting material while conducting the second etching, and wherein the second etching is conducted while masking all of some of said openings in the light restricting material with a photosensitive resist material, some of said photosensitive resist material being formed over said photosensitive resist layer.

10. The method of forming a phase shifting reticle of claim 1 wherein the openings are formed into the light restricting material by etching using an etching chemistry different than an etching chemistry used for the first etching.

11. The method of forming a phase shifting reticle of claim 1 wherein the light restricting material is opaque to at least 99% light transmission and the light transmissive material is transparent to at least 99% light transmission.

12. A method of forming a phase shifting reticle comprising:
    providing a substrate comprising an antireflective material formed over a reflective light restricting material formed over a light transmissive material;
    depositing a photosensitive resist layer over the antireflective material;
    forming a pattern of openings through the photosensitive resist layer, through the antireflective material and into the reflective light restricting material, the openings in the light restricting material being formed using the photosensitive resist layer as a mask;
    first etching depressions into the light transmissive material through the openings in the light restricting material while at least some of the same photosensitive resist layer from which the openings in the light restricting material were made remains over the antireflective material; and
    after the first etching, second etching exposed light transmissive material to form phase shift areas therein.

13. The method of forming a phase shifting reticle of claim 12 comprising removing all of said photosensitive resist layer from over the antireflective material prior to conducting the second etching.

14. The method of forming a phase shifting reticle of claim 12 comprising leaving at least some of said photosensitive resist layer over the antireflective material while conducting the second etching.

15. The method of forming a phase shifting reticle of claim 12 comprising leaving at least some of said photosensitive resist layer over the antireflective material while conducting the second etching, and forming another photosensitive resist layer over said photosensitive resist layer over the antireflective material prior to conducting the second etching.

16. The method of forming a phase shifting reticle of claim 15 wherein said photosensitive resist layer over the antireflective material and said another photosensitive resist layer constitute different resist materials.

17. The method of forming a phase shifting reticle of claim 12 wherein the second etching is conducted while masking all of some of said openings in the light restricting material with a photosensitive resist material.

18. The method of forming a phase shifting reticle of claim 12 comprising removing all of said photosensitive resist layer from over the antireflective material prior to conducting the second etching, and wherein the second etching is conducted while masking all of some of said openings in the light restricting material with a photosensitive resist material.

19. The method of forming a phase shifting reticle of claim 12 comprising leaving at least some of said photosensitive resist layer over the antireflective material while conducting the second etching, and wherein the second etching is conducted while masking all of some of said openings in the light restricting material with a photosensitive resist material, some of said photosensitive material being formed over said photosensitive resist layer.

20. A method of forming a phase shifting reticle comprising:
    providing a substrate comprising an antireflective material formed over a reflective light restricting material formed over a light transmissive material;
    depositing a photosensitive resist layer over the antireflective material;
    etching a pattern of openings through the photosensitive resist layer, through the antireflective material and through the reflective light restricting material to form a mask pattern considered as defined by the light restricting material and not by the photosensitive resist layer having light transmissive areas and light restricting areas over the substrate;
    masking all of the antireflective coating material over the light restricting areas within the mask pattern while etching light transmissive material within all light transmissive areas within the mask pattern; and
    forming some of the light transmissive areas to comprise phase shift areas.

21. The method of forming a phase shifting reticle of claim 20 wherein the forming of some of the light transmissive areas to comprise phase shift areas occurs after the masking.

22. The method of forming a phase shifting reticle of claim 20 wherein the forming of some of the light transmissive areas to comprise phase shift areas occurs after the masking, and wherein said masking and etching occurs while said photosensitive resist layer is the only photosensitive resist material on the substrate.

23. The method of forming a phase shifting reticle of claim 20 wherein the forming of some of the light transmissive areas to comprise phase shift areas comprises said masking and etching.

24. The method of forming a phase shifting reticle of claim 20 wherein the masking comprises use of a photosensitive material.

25. The method of forming a phase shifting reticle of claim 20 wherein the masking comprises use of at least some photosensitive material other than said resist layer.

26. The method of forming a phase shifting reticle of claim 20 wherein the masking does not comprise use of said photosensitive resist layer.

27. The method of forming a phase shifting reticle of claim 20 wherein the masking comprises use of a photosensitive material in addition to said photosensitive resist layer.

28. The method of forming a phase shifting reticle of claim 20 wherein the openings are formed through the light restricting material by etching using an etching chemistry different than an etching chemistry used for said light transmissive material etching.

29. The method of forming a phase shifting reticle of claim 20 wherein the forming of some of the light transmissive areas to comprise phase shift areas comprises removal of some of said light transmissive material within said some light transmissive areas.

30. The method of forming a phase shifting reticle of claim 20 wherein the forming of some of the light transmissive areas to comprise phase shift areas comprises etching of some of said light transmissive material within said some light transmissive areas.

31. A method of forming a phase shifting reticle comprising:

providing a substrate comprising light restricting material formed over light transmissive material;

depositing a photosensitive resist layer over the light restricting material;

forming a pattern of openings through the photosensitive resist layer and through the light restricting material to form a mask pattern considered as defined by the light restricting material and not by the photosensitive resist layer having light transmissive areas and light restricting areas over the substrate; and in one discrete etching step, etching the light transmissive material within all of the light transmissive areas within the mask pattern; in another discrete etching step, etching the light transmissive material within only some of the light transmissive areas within the mask pattern to form phase shift areas from at least some of said only some light transmissive areas, the etching of said all of the light transmissive areas occurring before the etching of said only some of the light transmissive areas.

32. The method of forming a phase shifting reticle of claim 31 wherein the discrete one and another etching steps use substantially the same etching chemistry and conditions.

33. The method of forming a phase shifting reticle of claim 31 wherein the openings are formed through the light restricting material by etching using an etching chemistry different than that used in either of the one and another discrete etching steps.

34. The method of forming a phase shifting reticle of claim 31 wherein the openings are formed through the light restricting material by etching using an etching chemistry different than that used in at least one of the two discrete etching steps.

35. The method of forming a phase shifting reticle of claim 31 wherein photosensitive resist material is received over the totality of the light restricting area within the mask pattern during the etching of said all.

36. The method of forming a phase shifting reticle of claim 31 wherein photosensitive resist material is received over the totality of the light restricting area within the mask pattern during the etching of said only some.

37. The method of forming a phase shifting reticle of claim 31 wherein photosensitive resist material is received over the totality of the light restricting area within the mask pattern during the etching of said only some, the photosensitive resist material having different thickness within at least some of said light restricting areas.

* * * * *

UNITED STATES PATENT AND TRADEMARK OFFICE
CERTIFICATE OF CORRECTION

PATENT NO.      : 6,183,915 B1                                      Page 1 of 1
DATED           : February 6, 2001
INVENTOR(S)     : J. Brett Rolfson It is certified that error appears in the above-identified patent and that said Letters Patent is hereby corrected as shown below:

Column 4,
Line 57, replace "differrnt" with -- different --.

Column 10,
Line 16, replace "two" with -- one and another --.

Signed and Sealed this

Seventh Day of August, 2001

*Attest:*

*Attesting Officer*

NICHOLAS P. GODICI
*Acting Director of the United States Patent and Trademark Office*